(12) United States Patent
Sato et al.

(10) Patent No.: US 9,475,733 B2
(45) Date of Patent: Oct. 25, 2016

(54) CERAMIC MATERIAL AND SPUTTERING TARGET MEMBER

(71) Applicant: NGK Insulators, Ltd., Nagoya (JP)

(72) Inventors: Yosuke Sato, Hashima-Gun (JP); Yoshinori Isoda, Ichinomiya (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/692,922

(22) Filed: Apr. 22, 2015

(65) Prior Publication Data

US 2015/0225297 A1  Aug. 13, 2015

Related U.S. Application Data

(63) Continuation of application No. PCT/JP2013/078841, filed on Oct. 24, 2013.

(30) Foreign Application Priority Data

Nov. 7, 2012  (JP) .................................. 2012-245465

(51) Int. Cl.
C04B 35/053  (2006.01)
C23C 14/34  (2006.01)
(Continued)

(52) U.S. Cl.
CPC ............ C04B 35/04 (2013.01); C04B 35/053 (2013.01); C23C 14/08 (2013.01); C23C 14/3414 (2013.01); H01L 21/02175 (2013.01); H01L 21/02194 (2013.01); H01L 21/02266 (2013.01); H01L 43/10 (2013.01); H01L 43/12 (2013.01);

(Continued)

(58) Field of Classification Search
CPC .. C04B 35/04; C04B 35/053; C23C 14/3414
See application file for complete search history.

(56) References Cited

U.S. PATENT DOCUMENTS

2005/0045065 A1* 3/2005 Sakurai ................. C04B 35/053
106/286.8
2006/0056115 A1  3/2006 Djayaprawira et al.
(Continued)

FOREIGN PATENT DOCUMENTS

JP  48-010044 B1  3/1973
JP  57-202603 A1  12/1982
(Continued)

OTHER PUBLICATIONS

Translation of the International Preliminary Report on Patentability, International Application No. PCT/JP2013/078841, dated May 21, 2015 (9 pages).
(Continued)

Primary Examiner — Karl Group
(74) Attorney, Agent, or Firm — Burr & Brown, PLLC (57) ABSTRACT

The present invention provides a ceramic material comprising magnesium, gallium, lithium, and oxygen as main components, wherein a crystal phase of a solid solution attained by dissolving gallium oxide and lithium oxide in magnesium oxide is a main phase. An XRD peak of a (200) plane of the solid solution with CuKα rays preferably appears at $2\theta=42.91°$ or more which is larger than an angle at which a peak of a Cubic crystal of magnesium oxide appears, more preferably appears at $2\theta=42.91°$ to $43.28°$, and further preferably appears at $2\theta=42.91°$ to $43.02°$. In the ceramic material, a molar ratio Li/Ga of Li to Ga is preferably 0.80 or more and 1.20 or less.

13 Claims, 3 Drawing Sheets (51) Int. Cl.
   *C04B 35/04* (2006.01)
   *H01L 43/10* (2006.01)
   *C23C 14/08* (2006.01)
   *H01L 21/02* (2006.01)
   *H01L 43/12* (2006.01)
   *G11B 5/39* (2006.01)

(52) U.S. Cl.
   CPC ............... *C04B 2235/3203* (2013.01); *C04B 2235/3286* (2013.01); *C04B 2235/76* (2013.01); *C04B 2235/77* (2013.01); *G11B 5/3909* (2013.01)

(56) References Cited

U.S. PATENT DOCUMENTS

| | | |
|---|---|---|
| 2008/0055793 A1 | 3/2008 | Djayaprawira et al. |
| 2008/0124454 A1 | 5/2008 | Djayaprawira et al. |
| 2008/0180862 A1 | 7/2008 | Djayaprawira et al. |
| 2011/0094875 A1 | 4/2011 | Djayaprawira et al. |
| 2012/0231945 A1 | 9/2012 | Watanabe et al. |
| 2014/0145185 A1* | 5/2014 | Ebata ............... C23C 14/08 257/43 |
| 2014/0284212 A1* | 9/2014 | Hisano ............... C04B 35/053 204/298.13 |

FOREIGN PATENT DOCUMENTS

| | | |
|---|---|---|
| JP | 2006-080116 A1 | 3/2006 |
| JP | 2007-305610 A1 | 11/2007 |
| WO | 2012/056808 A1 | 5/2012 |

OTHER PUBLICATIONS

Li Lei et al., "*Disorder-Activated Raman Spectra of Cubic Rocksalt-Type $Li_{(1-x)/2}Ga_{(1-x)/2}MxO$ (M=Mg, Zn) Alloys*," Journal of Applied Physics, 2012, vol. 112, pp. 043501-1 to 043501-6.

International Search Report and Written Opinion (Application No. PCT/JP2013/078841) dated Feb. 4, 2014.

\* cited by examiner

EXPERIMENTAL EXAMPLE 1

EXPERIMENTAL EXAMPLE 3

FIG. 5

CERAMIC MATERIAL AND SPUTTERING TARGET MEMBER

BACKGROUND OF THE INVENTION

1. Field of the Invention

The present invention relates to a ceramic material and a sputtering target member, and more specifically to a ceramic material and a sputtering target member containing magnesium oxide as a main component.

2. Description of the Related Art

Magnesium oxide (MgO) has been used for refractories, additives, electronic components, fluorescent materials, raw materials for target members, raw materials for superconducting thin film bases, tunnel barriers of magnetic tunnel junction elements (hereafter, MTJ elements), protective films for color plasma display panels (PDPs), and the like and have received attention as a material for a very wide range of uses. In particular, sputtering target members are used for forming tunnel barriers of MTJ elements that use a tunneling magnetoresistance effect. The tunneling magnetoresistance effect is a resistance-change phenomenon that occurs, in an MTJ element in which a very thin insulator with a thickness of several nanometers is sandwiched between two magnetic layers, when the relative directions of magnetization of the two magnetic layers are parallel or antiparallel. The tunneling magnetoresistance effect is applied to, for example, a magnetic head of a hard disk using a change in electrical resistance in the magnetization states.

In recent years, magnetoresistive random access memory (hereafter, MRAM) that uses the above-described MTJ elements has been studied (e.g. refer to PTL 1). In MRAM, for example, many MTJ elements are arranged and the magnetization alignment of each of the MTJ elements is used for an information carrier. MRAM has characteristics such as non-volatility, high-speed operation, and high endurance for many writings, and thus has been developed as memory that surpasses known semiconductor memories (e.g., SRAM and DRAM). Memories whose storage capacity is several megabits (Mbit) to several tens of megabits (Mbit) have been made on an experimental basis so far. However, the storage capacity needs to be further increased to a gigabit (Gbit) level to replace, for example, DRAM with MRAM.

Single crystal MgO or high-purity MgO have been generally used for film bodies of tunnel barriers of MTJ elements, and such a tunnel barrier has been generally formed by sputtering with a sputtering target member composed of a high-purity MgO sintered body. In recent years, however, an insulating film in which the tunneling magnetoresistance can be artificially changed by using a tunnel barrier in which part of MgO is replaced has been developed (e.g., refer to PTL 2 and PTL 3).

PATENT LITERATURE

PTL 1: JP 2006-80116
PTL 2: JP 2007-305610 A
PTL 3: WO 2012/056808 A

SUMMARY OF THE INVENTION

When a film body in which part of MgO is replaced produced, an element to be replaced with MgO is sputtered using a different target (co-sputtering) or an element to be replaced with MgO is sputtered using a single sputtering target containing different compounds (composite target). However, it can be easily imagined in the co-sputtering that the apparatus and process are complicated. In the composite target, when sputtering rates of the compounds are different from each other, a compound with a low sputtering rate may generate dust from the target. Therefore when a film body in which part of MgO is replaced is produced, the sputtering target is also desirably a sintered body in which part of MgO is replaced.

It is known that, for example, CoO and FeO form a complete solid solution with MgO, and a sintered body in which part of MgO is replaced can be easily produced using Co and Fe. However, other elements are not dissolved in MgO or are only dissolved in a high-temperature region, and thus a solid solution is often not produced at room temperature. For example, it is known that Al is dissolved in MgO in high-temperature region, but is precipitated as spinel at room temperature. Therefore, a solid solution in which part of MgO is replaced with Al cannot be produced at room temperature, except for a special method such as quenching. This may be because of the difference in valence number between Mg and Al. In PTL 3, a solid solution obtained by dissolving Al whose valence number is different from Mg is stably produced at room temperature by adding AlN and $Al_2O_3$ together to MgO. The ceramic material in PTL 3 includes, as a main phase, a crystal phase of an MgO—AlN solid solution obtained by dissolving an aluminum nitride component in magnesium oxide and has higher moisture resistance and water resistance than magnesium oxide.

However, in PTL 3, cation defects may be formed in Mg sites. Although the functions of the ceramic material are improved, defects are believed to be included in a crystal structure of the solid solution.

In view of the foregoing, it is a main object of the present invention to provide a novel ceramic material obtained by dissolving gallium in magnesium oxide and a sputtering target member.

As a result of extensive studies conducted to achieve the above main object, the present inventors have found that gallium oxide and lithium oxide can be dissolved in magnesium oxide by adding gallium oxide to magnesium oxide and also adding a component for generating lithium oxide under heating. Thus, the present invention has been completed.

A ceramic material according to the present invention includes: magnesium, gallium, lithium, and oxygen as main components, wherein a crystal phase of a solid solution obtained by dissolving gallium oxide and lithium oxide in magnesium oxide is a main phase.

A sputtering target member of the present invention is made of the above-described ceramic material.

Figure 1A:
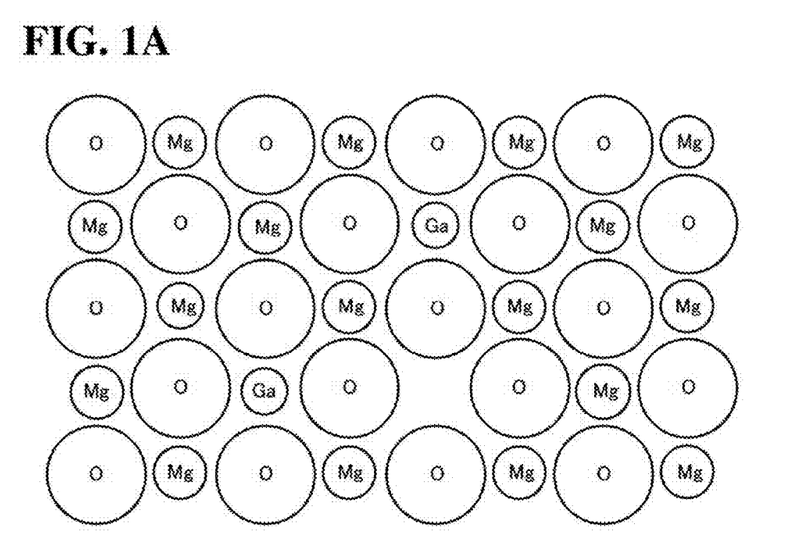
FIGS. 1A and 1B schematically show solid solutions in the case where gallium oxide is dissolved in magnesium oxide and the case where gallium oxide and lithium oxide are dissolved in magnesium oxide.
Figure 1B:
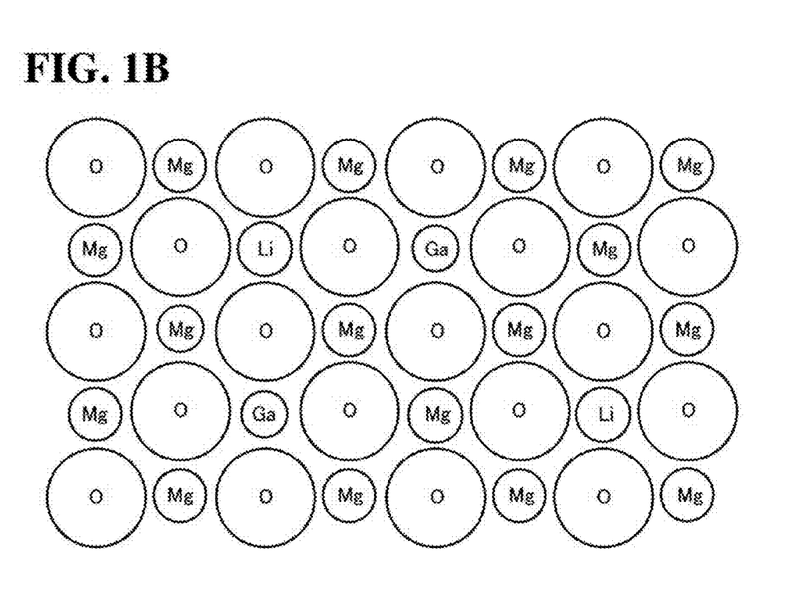

In the present invention, a novel material obtained by dissolving gallium oxide and lithium oxide in magnesium oxide can be provided. FIGS. 1A and 1B schematically shows solid solutions in the case where gallium oxide is dissolved in magnesium oxide. FIG. 1A shows the case where lithium does not coexist and FIG. 1B shows the case where lithium coexists. In general, gallium oxide ($Ga_2O_3$) is partially dissolved in magnesium oxide (MgO) at high temperature, but it is difficult at room temperature to obtain a solid solution in which magnesium oxide is replaced with gallium oxide in a high concentration and $MgGa_2O_4$ is likely to be precipitated. The reason for this may be as follows. When part of magnesium oxide is replaced with gallium oxide, cation defects are formed in magnesium sites to keep electroneutrality because the valence number of magnesium is 2 whereas the valence number of gallium is 3. Thus, structural instability is caused at room temperature (FIG.

1A). In contrast, the present invention can provide a material in which gallium oxide and lithium oxide are dissolved in part of magnesium oxide at room temperature. This may be because part of magnesium is replaced with gallium and the thus-formed cation defects are replaced with lithium, and thus the electroneutrality can be kept without forming cation defects (FIG. 1B). Furthermore, since a solid solution in which part of magnesium is replaced with gallium and lithium is obtained at room temperature, a film body in which part of magnesium is replaced with gallium and lithium can be obtained by performing sputtering that uses the ceramic material. For the above reason, cation defects are not easily formed in the film body. Therefore, when an MTJ element is produced, it is likely that a high magnetoresistance ratio is achieved and also a tunnel barrier is formed in which the tunnel resistance can be artificially changed, for example, the tunnel resistance is decreased by affecting the MgO tunnel barrier height through doping of gallium and lithium. In addition, since the dissolution of gallium oxide and lithium oxide changes the lattice constant of magnesium oxide, the lattice constant can be adjusted in accordance with the amounts of gallium oxide and lithium oxide dissolved. As to result, the lattice matching with a material on which a film is formed can be controlled. For example, the lattice matching with a magnetic layer in the MTJ element may be controlled.

DETAILED DESCRIPTION OF THE INVENTION

A ceramic material of the present invention contains magnesium (Mg), gallium (Ga), lithium (Li), and oxygen (O) as main components. The crystal phase of an MgO—$Ga_2O_3$—$Li_2O$ solid solution (a solid solution of the present invention, also simply referred to as a solid solution hereafter) obtained by dissolving gallium oxide and lithium oxide in magnesium oxide is a main phase.

in this ceramic material, an XRD peak of a (200) plane of the solid solution with CuKα rays preferably appears at $2\theta=42.91°$ or more which is larger than an angle at which a peak of a cubic crystal of magnesium oxide appears. When the crystal phase of the MgO—$Ga_2O_3$—$Li_2O$ solid solution obtained by dissolving gallium oxide and lithium oxide in magnesium oxide is formed, such a peak shift in XRD is believed to occur. As the amounts of the gallium oxide and lithium oxide dissolved increase, the XRD peak of the magnesium oxide shifts to higher angles. However, if the amounts of the gallium oxide and lithium oxide added are excessively increased, the gallium, oxide and lithium oxide are not completely dissolved, which readily generates minor phases (heterogeneous phases). Therefore, the XRD peak of a (200) plane of the solid solution preferably appears at $2\theta=42.91°$. This range is preferred because the amount of minor phases generated decreases. The XRD peak of a (200) plane of the solid solution more preferably appears at $2\theta=42.91°$ to $43.02°$. This range is particularly preferred because minor phases are substantially not contained.

The ceramic material of the present invention may contain, for example, magnesium-gallium composite oxide as minor phase, while the ceramic material preferably contains little minor phases and more preferably contains no minor phase. An example of the magnesium-gallium composite oxide is $MgGa_2O_4$. In addition to this phase, the ceramic material of the present invention may contain unknown components, but the content of the minor phases is preferably as low as possible. For example, the content of the minor phases is preferably 10 vol % or less (the content of the main phase is 90 vol % or more) more preferably 5 vol % or less (the content of the main phase is 95 vol % or more). Herein, the main phase refers to a component whose content is 50% or more on a volume basis. The minor phases are phases, other than the main phase, which are identified from XRD peaks. The main phase and the minor phases can be determined by observing a cross-section of the ceramic member with an electron microscope (SEM) to obtain an EPMA element mapping image. The area ratio measured by the cross-sectional observation is considered to reflect the volume ratio. Therefore, the main phase is defined as a region that occupies an area of 50% or more, which is determined by the microstructure observation with a SEM and the EPMA element mapping image. The minor phases are defined as regions other than the region of the main phase.

In the ceramic material of the present invention, the molar ratio Li/Ga of Li to Ga is preferably in the range of 0.80 or more and 1.20 or less, and more preferably in the range of or more and 1.15 or less. In consideration of the valence number of Mg, the valence number of Ga, and the valence number of Li, the molar ratio Li/Ga is ideally preferably 1.00. The molar ratio Li/Ga is determined by performing the chemical analysis of the ceramic material. The chemical analysis can be performed, for example, by dissolving the ceramic material and then performing chelatometry for Mg and inductively coupled plasma atomic emission spectroscopy for Ga and Li.

In the ceramic material of the present invention, assuming that contents of compounds containing magnesium, gallium, and lithium, the compounds being contained in a starting material, are respectively calculated based on magnesium oxide (MgO) gallium oxide ($Ga_2O_3$), and lithium oxide ($Li_2O$) and the total content of the magnesium oxide, the gallium oxide, and the lithium oxide is 100 mol %, the content of the magnesium oxide is preferably 70.0 mol % or more and 99.8 mol % or less, the content of the gallium oxide is preferably 0.1 mol % or more and 15.0 mol % or less, and the content of the lithium oxide is preferably 0.1 mol % or more and 15.0 mol % or less. In these ranges, gallium oxide can be dissolved in magnesium oxide. Furthermore, the content of the magnesium oxide is more preferably 90.0 mol % or more and 99.8 mol % or less, the content of the gallium oxide is more preferably 0.1 mol % or more and 5.0 mol % or less, and the content of the lithium oxide is more preferably 0.1 mol % or more and 5.0 mol % or less. Herein, the molar ratio of lithium oxide to gallium oxide is preferably about 1. For example, the molar ratio of lithium oxide to gallium oxide is preferably 0.80 or more, and more preferably 1 or more. These ranges are more preferably employed because the minor phases are substantially not contained. Note that the molar ratio is preferably 5 or less.

In the ceramic material of the present invention, in the solid solution, an XRD peak measured with CuKα rays may shift to higher angles with respect to an XRD peak of magnesium oxide measured with CUKα rays. Herein, the XRD peak of the solid solution shifts to higher angles by preferaby 0.01° or more and 0.10° or less and more preferably or less with respect to the XRD peak of magnesium oxide. When a crystal phase of an MgO—Ga$_2$O$_3$—Li$_2$O solid solution obtained by dissolving gallium oxide and lithium oxide in magnesium oxide is formed, such a peak shift in XRD it believed to occur. Herein, the phrase "with respect to an XRD peak of magnesium oxide" indicates that, if the ceramic material is formed on a base, an XRD peak of the ceramic material formed on the base shifts to higher angles with respect to an XRD peak measured in the tame state as that of the ceramic material, for example, in the state in which the magnesium oxide is formed on the same base.

The ceramic material of the present invention may be formed in a film like shape. For example, a film body may be formed on a base by using the ceramic material of the present invention as a sputtering target and performing sputtering. The film body formed by sputtering also includes, as a main phase, the crystal phase of the solid solution obtained by dissolving gallium oxide and lithium oxide in magnesium oxide. The film body may have a thickness of, for example, 1 nm or more and 1000 nm or less or 1 µm or more and 1000 µm or less. In the film body, an XRD peak measured with CuKα rays may shift to higher angles with respect to an XRD peak of magnesium oxide measured with CuKα rays. Herein, the XRD peak of the film body shifts to higher angles by preferably 0.01° or more and 0.10° or less and more preferably 0.06° or less with respect to the XRD peak of magnesium oxide. The base is not particularly limited and may be made of an inorganic material or an organic material. Examples of the base made of an inorganic material include substrates for semiconductors of silicon, silicon carbide, gallium nitride, and the lire and insulating substrates composed of alumina, quartz, and the like.

In the ceramic material, lower open porosity is preferable. The open porosity is preferably 36% or less, more preferably 8% or less, and further preferably 1% or less. Herein, the open porosity is measured by an Archimedean method that uses pure water as a medium. An open porosity of more than 36% is not preferred because the strength may decrease, the material itself may easily generate dust due to particle detachment, and dust components are easily collected in pores during the material processing or the like. The open porosity is preferably close to zero. Therefore, the open porosity does not have a particular lower limit.

The ceramic material can be used for a sputtering target member. That is, a sputtering target member of the present invention may be made of a ceramic material including, as a main phase, the crystal phase of the solid solution obtained by dissolving gallium oxide and lithium oxide in magnesium oxide. The ceramic material of the present invention is believed to maintain the crystal structure of magnesium oxide and have higher functions, and thus is preferably used for a sputtering target member. Herein, a ceramic material whose content of minor phases is low is preferably used for a sputtering target member. When the sputtering target member contains minor phases, the sputtering rate may be different between the main phase and the minor phases. However, if the content of the minor phases is low, the degradation of the homogeneity of a film to be formed can be suppressed and also the generation of dust from the sputtering target member can be further suppressed. In addition, since the lattice constant of the magnesium oxide is changed by dissolving gallium oxide and lithium oxide, the lattice constant can be adjusted in accordance with the amounts of gallium oxide and lithium oxide dissolved. As a result, the lattice matching with a material on which a film is formed can be controlled.

The sputtering target member may be used for forming, for example, a tunnel barrier of a magnetic tunnel junction element. The dissolution of gallium oxide and lithium oxide generates an impurity level in a band gap of magnesium oxide, and thus an effect of decreasing the tunnel barrier height and the like are expected. The ceramic material is preferably used for producing the magnetic tunnel junction element which is at least one of a magnetic head of a hard disk and a magnetoresistive random access memory. Since they require a low electrical resistance and a high magnetoresistance ratio, the ceramic material is suitably used.

Next, a method for producing a ceramic material according to the present invention will be described. The method for producing a ceramic material according to the present invention includes a mixing step of mixing a compound containing magnesium, a compound containing gallium, and a compound containing lithium to obtain a mixed powder and a firing step of firing the mixed powder to produce a ceramic material including, as a main phase, a crystal phase of a solid solution obtained by dissolving gallium oxide and lithium oxide in magnesium oxide.

In the mixing step, compounds containing magnesium, gallium, and lithium are mixed. Examples of the compounds containing magnesium, gallium, and lithium include oxides, hydroxides, carbonates, nitrates, sulfates, and chlorides of each element. The magnesium and the gallium are preferably in the form of oxides and the lithium is preferably in the form of carbonates or hydroxides. In the mixed powder composition, assuming that the contents of the compounds containing magnesium, gallium, and lithium, which are contained in a starting material, are respectively calculated based on magnesium oxide (MgO), gallium oxide (Ga$_2$O$_3$), and lithium oxide (Li$_2$O) and the total content of the magnesium oxide, the gallium oxide, and the lithium oxide is 100 mol %, the content of the magnesium oxide is preferably 70.0 mol % or more and 99.8 mol % or less, the content of the gallium oxide is preferably 0.1 mol % or more and 15.0 mol % or less, and the content of the lithium oxide is preferably 0.1 mol % or more and 15.0 mol % or less. In these ranges, gallium oxide can be dissolved in magnesium oxide. Furthermore, the content of the magnesium oxide is more preferably 90.0 mol % or more and 99.8 mol % or less, the content of the gallium oxide is more preferably 0.1 mol % or more and 5.0 mol % or less, and the content of the lithium oxide is more preferably 0.1 mol % or more and 5.0 mol % or less. Assuming that the contents of the raw materials are calculated based on magnesium oxide, gallium oxide, and lithium oxide, the molar ratio of the lithium oxide to the gallium oxide is preferably about 1. For example, the molar ratio is preferably 0.80 or more and more preferably 1 or more. These ranges are preferred because the minor phases are substantially not formed. Note that the molar ratio is preferably 5 or less.

In the firing step, the mixed powder is fired. In the firing step, firing may be performed at an atmospheric pressure, an increased pressure, or a reduced pressure. Alternatively, hot pressing may be performed. Among them, the hot pressing is preferred because the open porosity can be farther decreased. The hot pressing may be performed in an inert atmosphere at high temperature as long as the ceramic material is not reduced. Examples of the inert atmosphere include Ar, He, and $N_2$. In this step, the firing temperature is preferably 1200° C. or more, more preferably 1400° C. or more, and further preferably 1500° C. or more,. The firing temperature is preferably high because the open porosity can be further decreased. The firing temperature is more preferably 1200° C. or more in order to further suppress the formation of minor phases. The firing temperature is preferably, for example, 2000° C. or less in view of energy consumption when hot pressing is performed, the pressing pressure is preferably 50 to 300 kgf/cm$^2$. The atmosphere during the firing is preferably an atmosphere in which gallium oxide is not reduced into metal gallium and particularly preferably an atmosphere containing oxygen. The molding pressure before firing is not particularly limited, and may be suitably set to a pressure that can retain the shape.

After the firing step, the ceramic material may be further subjected to an annealing treatment which is a heat treatment performed in an oxidizing atmosphere. The annealing treatment is preferably performed after the firing is performed in an inert atmosphere, for example, after the hot pressing. An example of the oxidizing atmosphere is an air atmosphere. The annealing treatment temperature can be determined in accordance with the balance with the firing temperature and may be, for example, 1200° C. or more or 1400° C. or more. The annealing treatment temperature may be, for example, 2000° C. or less. It is believed that, as a result of the annealing treatment, oxygen defects can be further reduced.

According to the above-described ceramic material, and sputtering target member of this embodiment, a novel material obtained by dissolving gallium oxide and lithium oxide in magnesium oxide can be provided. For example(when part of MgO is replaced with $Ga_2O_3$, cation defects are formed in Mg sites to keep electroneutrality because the valence number of Mg is 2 whereas the valence number of Ga is 3. Thus, structural instability is caused at room temperature, and therefore it is difficult to obtain a solid solution in which magnesium oxide is replaced with gallium oxide in a high concentration and $MgGa_2O_4$ is likely to be precipitated. In contrast, in the ceramic material of the present invention, part of Mg is replaced with Ga and the thus-formed cation defects are replaced with Li. As a result, the electroneutrality is kept without forming cation defects, and thus gallium oxide and lithium oxide can be dissolved in magnesium oxide (refer to FIGS. 1A and 1B). Therefore, for example, a sputtering target that is used in a simple apparatus and process compared with co-sputtering and that does not easily generate dust compared with a composite target can be produced. For the above reason, cation defects are not easily formed. When an MTJ element is produced, it is likely that a high magnetoresistance ratio is achieved and also a tunnel barrier is formed in which the tunnel resistance can be artificially changed, for example, the tunnel resistance is decreased by doping of Ga and Li. Furthermore, since the dissolution of gallium oxide and lithium oxide changes the lattice constant of magnesium oxide, the lattice constant can be adjusted in accordance with the amounts of gallium oxide and lithium oxide dissolved. As a result, the lattice matching with a material on which a film is formed can be controlled. For example, the lattice matching with magnetic layer in the MTJ element may be controlled.

The present invention is not limited to the embodiments described above and can be implemented in various aspects within the scope of the present invention.

EXAMPLE

Hereafter, examples to which the present invention is suitably applied will be described. Experimental Examples 2 to 10, and 12 to 17 correspond to Examples of the present invention and Experimental Examples 1, 11, and 18 correspond to Comparative Examples.

Experimental Examples 1 to 13

In a mixing step, a commercially available MgO raw material, $Ga_2O_3$ raw material, and $Li_2CO_3$ raw material were weighed so as to satisfy the mass % shown in Table 1, and mixed in a wet process for four hours using isopropyl alcohol as a solvent, a pot made of nylon, and iron-core nylon balls having a diameter of 20 mm as rounded stones. After the mixing, the resulting slurry was taken out and dried in a nitrogen stream at 110° C. Subsequently, the dried mixture was passed through a 30-mesh sieve to prepare a mixed powder. In a molding step, the mixed powder was subjected to uniaxial compression molding at a pressure of 100 kgf/cm$^2$ to produce a disc-shaped molded body having a diameter of about 35 mm and a thickness of about 10 mm. The molded body was then pressed at 3000 kgf/cm$^2$ by cold isostatic pressing (CIP). In a firing step, the disc-shaped molded body was inserted into a sagger made of MgO and hermetically sealed, and fired in the air at a predetermined temperature. The firing was performed at the maximum temperature shown in Table 1, and the maximum temperature was kept for two hours.

Experimental Examples 14, 16, and 18

After the mixed powder was prepared by the same method as above, the mixed powder was subjected to uniaxial compression molding at a pressure of 100 kgf/cm$^2$ to produce a disc-shaped molded body having a diameter of about 50 mm and a thickness of about 20 mm. The disc-shaped molded body was inserted into a graphite mold for firing. In a firing step, the disc-shaped molded body was subjected to hot pressing to obtain a ceramic material. In the hot pressing, the pressing pressure was 200 kgf/cm$^2$, firing was performed at the firing temperature (maximum temperature) shown in Table 1, and an $N_2$ atmosphere was kept until the completion of the firing. The firing temperature was kept for four hours.

Experimental Examples 15 and 17

The ceramic material obtained by the hot pressing was further subjected to an annealing treatment in the air. The ceramic material obtained by the hot pressing in Experimental Example 14 was subjected to an annealing treatment. As the annealing treatment, the ceramic material was inserted into a sagger made of MgO, hermetically sealed, and fired at 1450° C. for five hours in the air to obtain a ceramic material of Experimental Example 15. The ceramic material of Experimental Example 16 was subjected to an annealing treatment in the air by the same method as above to obtain a ceramic material of Experimental Example 17.

Sample for Sputtering

Sputtering targets were produced using sintered bodies produced so as to have the compositions in Experimental Examples 3 and 11, and sputtering was performed. Each of the sputtering targets was produced as follows. The size was changed, firing was performed by the same method as in Experimental Examples 3 and 11, and processing was performed to obtain a sintered body having a diameter of 100 mm and a thickness of 3 mm. The sintered body was then joined to a backing plate. Sputtering was performed with a magnetron RF sputtering apparatus at normal temperature for 120 minutes under the following conditions: ultimate vacuum 5×10$^{-4}$ Pa, sputtering gas pressure 0.1 Pa, sputtering gas 20 sccm (25° C.) in total at a ratio of Ar/O$_2$=99.5/0.5, and sputtering output 400 W. The substrate was a silicon substrate.

Evaluation

The materials produced in Experimental Examples 1 to 18 were processed into materials for various evaluations, and the following evaluations were performed. Table 1 shows the evaluation results.

(1) Bulk Density and Open Porosity

The bulk density and the open porosity were measured by an Archimedean method that uses pure water as a medium.

(2) Evaluation of Crystal Phase

Each of the materials was crushed with a mortar, and the crystal phase was identified using an X-ray diffractometer. The measurement conditions were Cα, 40 kV, 40 mA, and 2θ=10-70°, and a sealed-tube X-ray diffractometer (D8 ADVANCE manufactured by Bruker AXS K. K.) was used. The measurement conditions for sputtered films were CuKα, 50 kV, 300 mA, and 2θ=10-70°, and an X-ray diffractometer (RINT 2000 manufactured by Rigaku Corporation) was used. The step size of the measurement was 0.02°. When the diffraction angle at a peak top was identified, in a powder sample, 3 mass % of a Si standard sample powder (SRM640C) manufactured by NIST was added as an internal standard to correct the peak position. A value of ICDD 78-0430 was used as the diffraction angle at a peak top of magnesium oxide. The peak positions of an MgO—Ga$_2$O$_3$—Li$_2$O solid solution were determined as follows.

(3) Peak Position

In order to relatively compare the amounts of Ga and Li dissolved in the MgO—Ga$_2$O$_3$—Li$_2$O solid solution, the peak position of a (200) plane of the MgO—Ga$_2$O$_3$—Li$_2$O solid solution was determined. In the measurement result, it was confirmed that diffraction peaks were detected near an MgO (111) plane (36.93°), (200) plane (42.90°), and (220) plane (62.29°) as shown in ICDD 78-0430. Then, the beak position was determined using the peak at the diffraction angle of the (200) plane as a (200) plane of the MgO—Ga$_2$O$_3$—Li$_2$O solid solution itself.

(4) Constituent Element

A portion of the obtained sintered body was crushed with a mortar and then subjected to chemical analysis. The chemical analysis was performed by dissolving the samples for Mg, Ga, and Li and then performing chelatometry for Mg and inductively coupled plasma-atomic emission spectroscopy for Ga and Li. Mass % of O was determined by subtracting mass % of mg, mass % of Ga, and mass % of Li from 1.00 mass % which was assumed to be the total. The mass percentage of each element was divided by the atomic weight of the corresponding element, and then at % of each element, the sum of which was 100 at %, was determined. The ratio of Li to Ga (Li/Ga ratio) was determined. For the sputtered film of Experimental Example 3, the secondary ion intensities of Mg, Ga, and Li were measured by SIMS for the sintered body and the sputtered film. The same measurement conditions were applied to the sintered body and the sputtered film.

Evaluation Results

Figure 2:
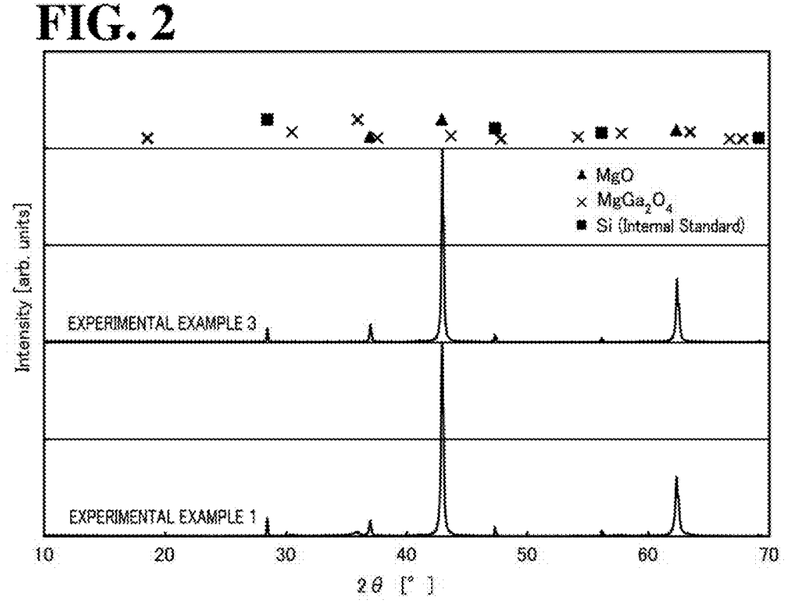
FIG. 2 shows measurement results of XRD in Experimental Examples 1 and 3.
Figure 3:
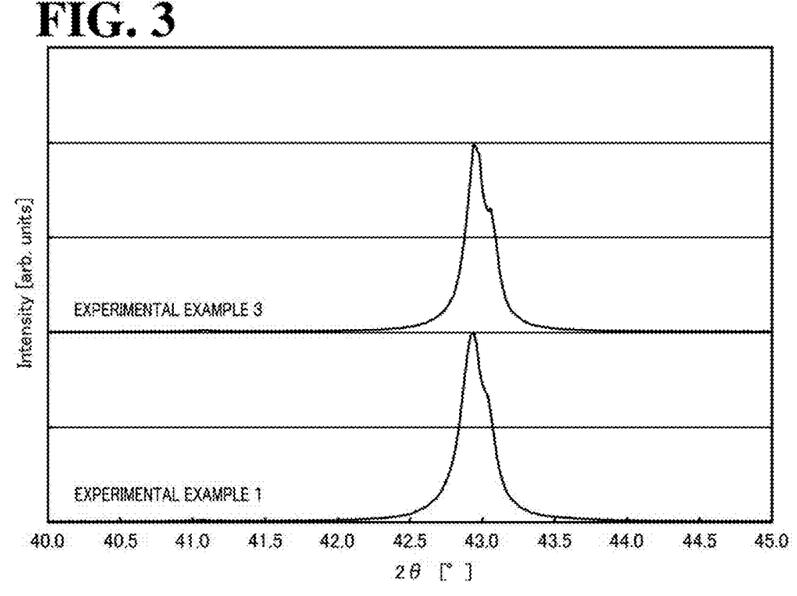
FIG. 3 is an enlarged view of peaks of solid solution crystal phases obtained by XRD measurement in Experimental Examples 1 and 3.

As a result of the evaluation of crystal phases, it was found that, in the ceramic materials of Experimental Examples 2 to 10 and 12 to 17 in which Li$_2$CO$_3$ was added, the XRD peaks of a (111) plane, a (200) plane, and a (220) plane of the magnesium oxide shifted to higher angles. Table 1 shows, as a representative example, a peak position of the XRD peak that indicates a (200) plane near 42.90°. FIG. 2 shows XRD analysis charts of Experimental Example 1 and Experimental Example 3 as representative examples, and FIG. 3 is an enlarged view near the (200) plane. Experimental Examples other than Experimental Examples 1 and 3 are not shown because the contents of the MgO—Ga$_2$O$_3$—Li$_2$O solid solution and MgGa$_2$O$_4$ serving as a minor phase were changed. As shown in FIGS. 2 and 3, the peak position shifted to higher angles with respect to the peak position of ICDD 78-0430 in both Experimental Examples 1 and 3. This may be because the ionic radius of Ga$^{3+}$ (0.62 Å) is smaller than the ionic radius of with six coordination expected in a rock salt structure and the ionic radius of Li$^+$ (0.76 Å) is larger than the ionic radius of Mg$^{2+}$ (0.72 Å), and Mg$^{2+}$ was replaced with a single ion of Ga$^{3+}$ and a single on of Li$^+$ dissolution and thus the lattice shrank on the whole. In Experimental Example 1 in which Li$_2$CO$_3$ was not added, a trace amount of an MgO—Ga$_3$O$_3$ solid solution was considered to be formed. In Experimental Example 3 in which Li$_2$CO$_3$ was added, an MgO—Ga$_2$O$_3$—Li$_2$O solid solution was considered. to be formed. As a result of XRD analysis and EPMA analysis or microstructure observation performed on Experimental Examples 1 to 18, it was found that the MgO—Ga$_2$O$_3$—Li$_2$O solid solution was a main phase in Experimental Examples, 2 to 10 and 12 to 17. In the MgO—Ga$_2$O$_3$—Li$_2$O solid solution, it is expected that Li$_2$O is dissolved in Ga$_2$O$_3$ at an equimolar ratio to keep electroneutrality. Therefore, it was considered that Ga$_2$O$_3$ was completely dissolved and thus the minor phases were not present in Experimental Examples 3 to 8 and 12 to 17 in which the molar ratio Li/Ga was about 1 or more whereas minor phases derived from an excess amount of Ga$_2$O$_3$ were formed in Experimental Example 2 in which the molar ratio Li/Ga was less than I. In Experimental Examples 9 and 10, the minor phases were formed despite the fact that the molar ratio Li/Ga was 1. This may be because the amounts of Ga$_2$O$_3$ and Li$_2$O added were large and thus exceeded the solid-solubility limit of MgO. In Experimental Example 7, when an excess amount of Li$_2$O relative to Ga$_2$O$_3$ was added, minor phases were not found. This may be because an excess amount of Li$_2$O was volatilized and did not remain in the ceramic material. Note that the main phase refers to a component whose content is 50% or more on a volume basis and the minor phases refer to phases, other than the main phase, which are identified by XRD analysis or which are not identified by XRD analysis but whose peak is clearly detected. The area ratio measured by cross-sectional observation is considered to reflect the volume ratio. Therefore, the main phase is defined as a region that occupies an area of 50% or more, which is determined by the SEM observation and the EPMA element mapping image. Other methods for quantification of the main phase and minor phases may be employed as long as the volume ratio of phases can be identified.

TABLE 1

| Composition | MgO (mass %) | Ga$_2$O$_3$ (mass %) | Li$_2$CO$_3$ (mass %) | MgO (mol %) | Ga$_2$O$_3$ (mol %) | Li$_2$O (mol %) | Firing Temperature (° C.) | Firing Atmosphere | Bulk Density (g/cm$^3$) | Open Porosity (%) | Main Phase[1] | Minor Phase | Peak Position[2] (°) | Li/Ga Molar Ratio |
|---|---|---|---|---|---|---|---|---|---|---|---|---|---|---|
| Experimental Example 1 | 94.37 | 5.63 | 0 | 98.73 | 1.27 | 0.00 | 1500 | Air | 3.60 | 0.02 | MgOss1 | MgGa$_2$O$_4$ | 42.94 | |
| Experimental Example 2 | 93.34 | 5.57 | 1.10 | 98.11 | 1.26 | 0.63 | 1500 | Air | 3.55 | 0.32 | MgOss2 | MgGa$_2$O$_4$ | 42.94 | |

TABLE 1-continued

| Composition | MgO (mass %) | Ga$_2$O$_3$ (mass %) | Li$_2$CO$_3$ (mass %) | MgO (mol %) | Ga$_2$O$_3$ (mol %) | Li$_2$O (mol %) | Firing Temperature (° C.) | Firing Atmosphere | Bulk Density (g/cm$^3$) | Open Porosity (%) | Main Phase[1] | Minor Phase | Peak Position[2] (°) | Li/Ga Molar Ratio |
|---|---|---|---|---|---|---|---|---|---|---|---|---|---|---|
| Experimental Example 3 | 92.33 | 5.30 | 2.37 | 97.43 | 1.20 | 1.36 | 1500 | Air | 3.51 | 0.00 | MgOss2 | Not found | 42.96 | 1.11 |
| Experimental Example 4 | 92.33 | 5.30 | 2.37 | 97.43 | 1.20 | 1.36 | 1200 | Air | 2.13 | 35.61 | MgOss2 | Not found | 42.93 | |
| Experimental Example 5 | 92.33 | 5.30 | 2.37 | 97.43 | 1.20 | 1.36 | 1400 | Air | 3.48 | 0.01 | MgOss2 | Not found | 42.96 | |
| Experimental Example 6 | 92.33 | 5.30 | 2.37 | 97.43 | 1.20 | 1.36 | 1600 | Air | 3.52 | 0.00 | MgOss2 | Not found | 42.94 | |
| Experimental Example 7 | 90.36 | 5.39 | 4.25 | 96.29 | 1.24 | 2.47 | 1500 | Air | 3.45 | 0.56 | MgOss2 | Not found | 42.96 | |
| Experimental Example 8 | 79.18 | 14.93 | 5.89 | 92.50 | 3.75 | 3.75 | 1500 | Air | 3.46 | 0.09 | MgOss2 | Not d foun | 43.02 | |
| Experimental Example 9 | 55.23 | 32.11 | 12.66 | 79.99 | 10.00 | 10.00 | 1500 | Air | 3.37 | 3.07 | MgOss2 | MgGa$_2$O$_4$ | 43.18 | |
| Experimental Example 10 | 41.85 | 41.71 | 16.44 | 70.00 | 15.00 | 15.00 | 1500 | Air | 3.32 | 7.98 | MgOss2 | MgGa$_2$O$_4$ | 43.28 | |
| Experimental Example 11 | 100 | 0 | 0 | 100.00 | 0.00 | 0.00 | 1500 | Air | 3.24 | 4.29 | MgO | Not found | 42.90 | |
| Experimental Example 12 | 95.99 | 2.84 | 1.16 | 98.72 | 0.63 | 0.65 | 1500 | Air | 3.55 | 0.00 | MgOss2 | Not found | 42.93 | 1.04 |
| Experimental Example 13 | 88.33 | 8.35 | 3.32 | 96.08 | 1.95 | 1.97 | 1500 | Air | 3.56 | 0.00 | MgOss2 | Not found | 42.98 | 1.01 |
| Experimental Example 14 | 96.00 | 2.84 | 1.16 | 98.72 | 0.63 | 0.65 | 1300 | N$_2$ | 3.61 | 0.01 | MgOss2 | Not found | 42.92 | |
| Experimental Example 15[3] | 96.00 | 2.84 | 1.16 | 98.72 | 0.63 | 0.65 | 1300 | N$_2$ | 3.59 | 0.03 | MgOss2 | Not found | 42.93 | 0.97 |
| Experimental Example 16 | 88.33 | 8.31 | 3.36 | 96.06 | 1.94 | 2.00 | 1300 | N$_2$ | 3.68 | 0.10 | MgOss2 | Not found | 42.98 | |
| Experimental Example 17[3] | 88.33 | 8.31 | 3.36 | 96.06 | 1.94 | 2.00 | 1300 | N$_2$ | 3.65 | 0.03 | MgOss2 | Not found | 42.96 | 1.03 |
| Experimental Example 18 | 100 | 0 | 0 | 100.00 | 0.00 | 0.00 | 1500 | N$_2$ | 3.57 | 0.30 | MgO | Not found | 42.90 | |

[1]MgOss1 refers to an MgO—Ga$_2$O$_3$ solid solution and MgOss2 refers to an MgO—Ga$_2$O$_3$—Li$_2$O solid solution
[2]Peak position of MgO (200)
[3]Annealing treatment in the air at 1450° C. after the hot pressing in Experimental Examples 14 and 16

Figure 4:
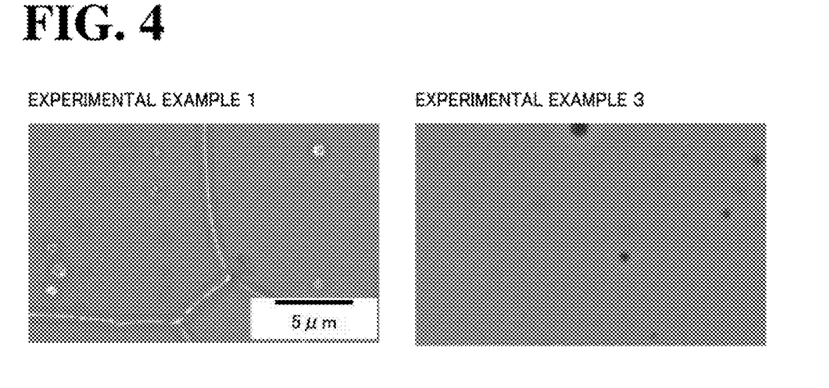
FIG. 4 shows SEM backscattered electron images in Experimental Examples 1 and 3.

FIG. 4 shows backscattered electron images by SEM observation in Experimental Examples 1 and 3. Referring to FIG. 4, a gray phase was observed in grain boundaries and the precipitation of minor phases (heterogeneous phases) was expected in Experimental Example 1 in which Li was not added whereas such a phase was not observed in Experimental Example 3. Therefore, it was considered in Experimental Example 3 that an MgO—Ga$_2$O$_3$—Li$_2$O solid solution obtained by dissolving Ga$_2$O$_3$ and Li$_2$O in MgO was formed because the peak position of the (200) plane shifted to higher angles, the molar ratio Li/Ga was 1 mole or more and the minor phases were not observed, and a bright phase was not observed in the backscattered electron image compared with a matrix. Although there is a difference in the formation of minor phases, the MgO—Ga$_2$O$_3$—Li$_2$O solid solution was also considered to be formed in Experimental Examples 2 and 4 to 10. Furthermore, it was found that the amount of heterogeneous phases was smaller when the XRD peak of the (200) plane appeared at 2θ=42.91° to 43.28°, and heterogeneous phases were substantially not contained when the XRD peak of the (200) plane appeared at 2θ=42.91° to 43.02°.

In Experimental Examples 4 to 6, the heat treatment was performed at 1200° C., 1400° C., and 1600° C., respectively. Compared with the heat treatment at 1500° C., the peak position of the (200) plane shifted to higher angles and minor phases were not observed. Therefore, the solid solution state was not considerably changed, and an MgO—Ga$_2$O$_3$—Li$_2$O solid solution was found to be obtained. Also in Experimental Examples 14 to 17 in which the heat treatment was performed at 1300° C., the solid solution state as not considerably changed, and an MgO—Ga$_2$O$_3$—Li$_2$O solid solution was found to be obtained.

In Experimental Examples 14 to 17 in which hot pressing was performed in an N$_2$ atmosphere, an MgO—Ga$_2$O$_3$—Li$_2$O solid solution not including minor phases was obtained as in Experimental Example 3 in which the firing was performed in the air. This suggests that hot pressing is a better method to obtain a dense sintered body having low open porosity. As is clear from the above results, the heat treatment temperature is preferably 1200° C. or more, more preferably 1.300° C. or more, and further preferably 1400° C. or more. In view of energy consumption, the firing temperate is believed to be desirably 2000° C. or less, In Experimental Examples 15 and 17, an annealing treatment (oxidizing treatment) was performed in the air after the hot pressing in Experimental Examples 14 and 16. It was found that, even if the annealing treatment was performed, the MgO—Ga$_2$O$_3$—Li$_2$O solid solution did not change and additional minor phases were not formed, and thus the ceramic material was stable. Furthermore, the ceramic materials of Experimental Examples 14 and 16 showed gray on the whole after hot pressing, and were assumed to have oxygen defects. The ceramic materials of Experimental Examples 15 and 17 after the annealing treatment showed White on the Whole, and the oxygen defects were assumed to be eliminated. Therefore, it was found to be effective in order to eliminate oxygen defects that the ceramic material is subjected to an annealing treatment in an oxidizing atmosphere after hot pressing.

Figure 5:
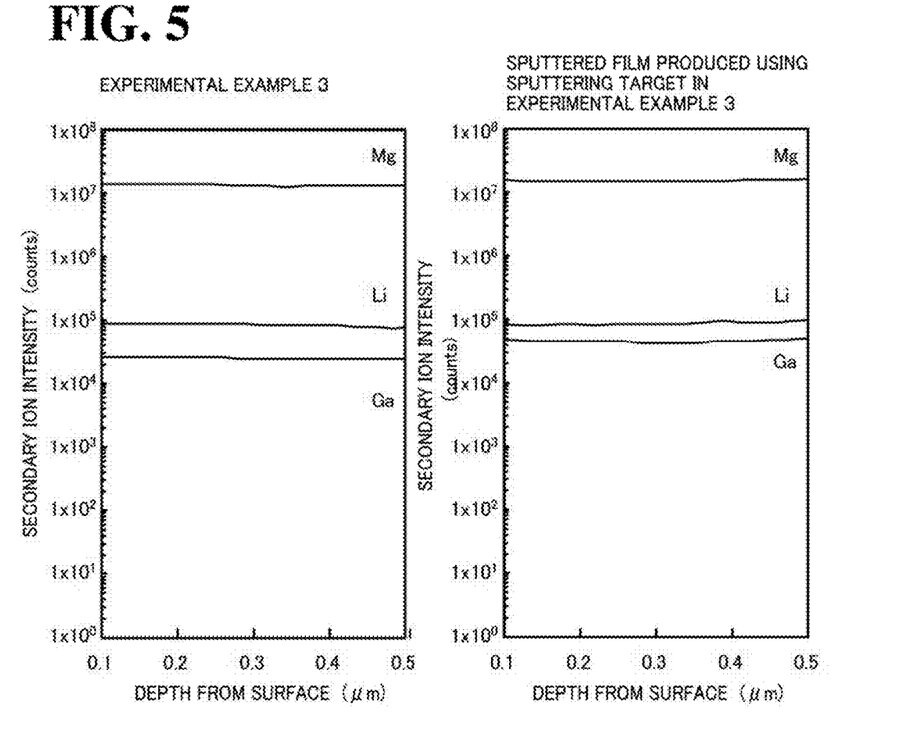
FIG. 5 shows SIMS measurement results of Experimental Example 3 and a sputtered film produced from Experimental Example 3.

Next, sputtered films produced using the sputtering targets formed of the materials in Experimental Examples 3 and 11 were subjected to XRD analysis. Furthermore, the ceramic material in Experimental Example 3 and a sputtered film produced using the sputtering target in Experimental Example 3 were subjected to SIMS analysis. In the sputtered film produced from the material in Experimental Example 3, minor phases other than MgO were not found from the XRD analysis. In both the sputtered films produced from the targets in Experimental Examples 3 and 11, the XRD peak of the (111) plane shifted to lower angles compared with the sintered bodies. The XRD peak of the (111) plane of the sputtered film in Experimental Example 3 shifted to higher angles by 0.06° compared with the XRD peak of the (111) plane of the sputtered film in Experimental Example 11. The shift to lower angles in the sputtered film in Experimental Example 11 is believed to be due to the influence of a deposition substrate. Although the shift in the sputtered film in Experimental Example 3 is also believed to be due to such an influence, the XRD peak in the sputtered film in Experimental Example 3 shifted to higher angles compared with the XRD peak in the sputtered film in Experimental Example 11. This may be because gallium oxide and lithium oxide were dissolved in magnesium oxide. FIG. 5 shows the SIMS measurement results of the ceramic material in Experimental Example 3 and the sputtered film produced from the sputtering target in Experimental Example 3. The secondary ion intensities of Mg, Li, and Ga were measured at a depth of about 0.1 μm to 0.5 μm from the outermost surface in order to remove the influence of contaminants and the like on the outermost surface. In FIG. 5, the horizontal axis shows the depth from the surface and the vertical axis shows the secondary ion intensity of each element. Since there is no significant difference in the secondary ion intensities of Mg, Ga, and Li between the sintered body and the sputtered film, the sintered body and the sputtered film are believed to have substantially the same composition. In the XRD analysis, the peak shift to higher angles was observed compared with the sputtered film constituted by only MgO in Experimental Example 11 and the minor phases were not observed. In the SIMS analysis, the sintered body and the sputtered film had substantially the Same composition. Therefore, it was found that the MgO—$Ga_2O_3$—$Li_2O$ solid solution was also formed in the film body produced from the ceramic material by sputtering. It is known that the crystal plane that appears in the sputtered film is dependent on the ultimate vacuum of an apparatus, and thus a film having a crystal plane other than (111) can be formed by controlling the ultimate vacuum (Reference Document: J. Vac. Soc. Jpn. Vol. 43, No. 2, 2000 (p135)).

As described above in detail, the produced ceramic material can provide a sputtering target in which $Ga_2O_3$ and $Li_2O$ are dissolved in part of MgO at room temperature. This is assumed to be as follows. Part of Mg is replaced with Ga and the thus-formed cation defects are replaced with Li. As a result, the electroneutrality is kept without forming cation defects. In particular, when minor phases are not formed, a sputtering target that is used in a simple apparatus and process compared with co-sputtering and that does not easily generate dust compared with a composite target can be produced. Furthermore, since a solid solution is obtained, in which Dart of MgO is replaced with $Ga_2O_3$ and $Li_2O$ at room temperature, a film body in which part of MgO is replaced with $Ga_2O_3$ and $Li_2O$ can be produced by sputtering. Cation defects are not easily formed in this film body for the above reason. Therefore, when an MTJ element is produced, it is likely that the magnetoresistance ratio is maintained and also a tunnel barrier is formed in which the tunnel resistance can be artificially changed, for example, the tunnel resistance is decreased due to the influence of is and Li.

The present invention claims priority from Japanese patent application No. 2012-245465 filed on Nov. 7, 2012, the entire contents of which are incorporated herein by reference.

INDUSTRIAL APPLICABILITY

The ceramic material of the present invention is used as a sputtering target member for producing a magnetic tunnel junction element such as a magnetic head of a hard disk and a magnetoresistive random access memory.

What is claimed is:

1. A ceramic material comprising magnesium, gallium, lithium, and oxygen as main components, wherein a crystal phase of a solid solution obtained by dissolving gallium oxide and lithium oxide in magnesium oxide is a main phase,
   wherein, assuming that contents of compounds containing magnesium, gallium, and lithium, the compounds being contained in a starting material, are respectively calculated based on magnesium oxide (MgO), gallium oxide ($Ga_2O_3$), and lithium oxide ($Li_2O$) and a total content of the magnesium oxide, the gallium oxide, and the lithium oxide is 100 mol %, a content of the magnesium oxide is 90.0 mol % or more and 99.8 mol % or less, a content of the gallium oxide is 0.1 mol % or more and 5.0 mol % or less, and a content of the lithium oxide is 0.1 mol % or more and 5.0 mol % or less.

2. The ceramic material according to claim 1, wherein an XRD peak of a (200) plane of the solid solution measured with CuKα rays appears at 2θ=42.91° or more which is larger than an angle at which a peak of a cubic crystal of magnesium oxide appears.

3. The ceramic material according to claim 1, wherein an XRD peak of a (200) plane of the solid solution measured with CuKα rays appears at 2θ=42.91° to 43.28°.

4. The ceramic material according to claim 1, wherein an XRD peak of a (200) plane of the solid solution measured with CuKα rays appears at 2θ=42.91° to 43.02°.

5. The ceramic material according to claim 1, wherein the ceramic material does not contain $MgGa_2O_4$ as a minor phase.

6. The ceramic material according to claim 1, wherein a molar ratio Li/Ga of Li to Ga is 0.80 or more and 1.20 or less.

7. The ceramic material according to claim 1, wherein in the solid solution, an XRD peak measured with CuKα rays shifts to higher angles with respect to an XRD peak of magnesium oxide measured with CuKα rays.

8. The ceramic material according to claim 1, wherein in the solid solution, an XRD peak measured with CuKα rays shifts to higher angles by 0.01° or more and 0.10° or less with respect to an XRD peak of magnesium oxide measured with CuKα rays.

9. The ceramic material according to claim 7, being formed in a film-like shape.

10. The ceramic material according to claim 8 being formed in a film-like shape.

11. A sputtering target member comprising the ceramic material according to claim 1.

12. The sputtering target member according to claim 11, being used for producing a tunnel barrier of a magnetic tunnel junction element.

13. The sputtering target member according to claim 12, being used for producing the magnetic tunnel junction element, the magnetic tunnel junction element being at least one of a magnetic head of a hard disk and a magnetoresistive random access memory.

\* \* \* \* \*

UNITED STATES PATENT AND TRADEMARK OFFICE
CERTIFICATE OF CORRECTION

| | |
|---|---|
| PATENT NO. | : 9,475,733 B2 |
| APPLICATION NO. | : 14/692922 |
| DATED | : October 25, 2016 |
| INVENTOR(S) | : Yosuke Sato, Yoshinori Isoda and Yuji Katsuda |

Page 1 of 1

It is certified that error appears in the above-identified patent and that said Letters Patent is hereby corrected as shown below:

On the Title Page

Item (57), Abstract, Lines 1-3:
Please change: "The present invention provides a ceramic material comprising magnesium, gallium, lithium, and oxygen as main components, wherein a crystal phase of a solid solution attained" to -- The present invention provides a ceramic material comprising magnesium, gallium, lithium, and oxygen as main components, wherein a crystal phase of a solid solution obtained --

Other Publications, Page 2, Right Column:
Please change: "Li Lei et al., *"Disorder-Activated Raman Spectra of Cubic Rocksalt-Type $Li_{(1-x)/2}Ga_{(1-x)/2}MxO$ (M = Mg, Zn) Alloys,"* Journal of Applied Physics, 2012, Vol. 112, pp. 043501-1 to 043501-6." to -- Li Lei et al., *"Disorder-Activated Raman Spectra of Cubic Rocksalt-Type $Li_{(1-x)/2}Ga_{(1-x)/2}MxO$ (M = Mg, Zn) Alloys,"* Journal of Applied Physics, 2012, Vol. 112, pp. 043501-1 to 043501-6. --

Signed and Sealed this
Twenty-third Day of May, 2017

Michelle K. Lee
*Director of the United States Patent and Trademark Office*